US006734632B2

(12) United States Patent
Yamaguchi

(10) Patent No.: US 6,734,632 B2

(45) Date of Patent: May 11, 2004

(54) ELECTRIC DISCHARGE LAMP DEVICE

(75) Inventor: Hironao Yamaguchi, Gamagori (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 09/984,527

(22) Filed: Oct. 30, 2001

(65) Prior Publication Data

US 2002/0053885 A1 May 9, 2002

(30) Foreign Application Priority Data

Nov. 7, 2000 (JP) ....................................... 2000-339321

(51) Int. Cl.[7] ............................. H01J 13/46; H01J 1/46

(52) U.S. Cl. ............................. 315/57; 315/58; 315/82; 315/77; 362/294; 362/296; 362/61

(58) Field of Search ............................. 315/57, 58, 56, 315/82, 77, 59, 76; 362/294, 296, 61, 74, 218, 297, 310, 274, 341, 345; 313/318.11, 318.12, 284, 288, 292

(56) References Cited

U.S. PATENT DOCUMENTS 5,119,275 A 6/1992 Makita ........................ 362/61
5,609,407 A * 3/1997 Yanagihara et al. ........ 362/547
5,838,109 A * 11/1998 Kobayashi et al. ........... 315/58
6,066,921 A 5/2000 Nakamura et al. ............ 315/71
6,419,382 B1 * 7/2002 Nakagawa et al. ......... 362/547

FOREIGN PATENT DOCUMENTS

| | | |
|---|---|---|
| DE | 19753605 | 6/1999 |
| FR | 2704937 | 11/1994 |
| JP | A-10-228804 | 8/1998 |
| JP | A-2001-101909 | 4/2001 |

* cited by examiner

*Primary Examiner*—Don Wong
*Assistant Examiner*—Tuyet Thi Vo
(74) *Attorney, Agent, or Firm*—Posz & Bethards, PLC

(57) ABSTRACT

An electric discharge lamp device prevents a temperature rise in the circuit device when an electric discharge lamp (30) is operated without the use of a high voltage wire and a high voltage connector. The electric discharge lamp device includes a reflecting member (20) and a circuit device (40) that is directly connected with the electric discharge lamp (30) without using a high voltage wire. The distance between the reflecting member (20) and the circuit device (40) is set at a value not less than 6 mm. In operation, a beam of light emitted from the electric discharge lamp (30) is reflected forward by a concave reflecting face of the reflecting member (20).

4 Claims, 4 Drawing Sheets

ELECTRIC DISCHARGE LAMP DEVICE

BACKGROUND OF THE INVENTION

1. Field of the Invention

The present invention relates to an electric discharge lamp device, the light source of which is an electric discharge lamp, in which the electric discharge lamp is directly connected with a circuit device for generating a high voltage to operate the electric discharge lamp.

2. Description of the Related Art

An electric discharge lamp device, the light source of which is an electric discharge lamp, is used for a headlight for vehicle use. In order to operate the electric discharge lamp, it is necessary to impress a high voltage upon the electric discharge lamp. Therefore, the electric discharge lamp is electrically connected with a circuit means, or circuit device, for generating a high voltage by a high voltage wire.

However, in the structure of connecting the electric discharge lamp with the circuit means device by the high voltage wire, it is necessary to shield the high voltage wire so as to prevent noise being generated by the high voltage wire. Further, in order to connect the high voltage wire with the electric discharge lamp, it is necessary to provide a high voltage connector. Accordingly, the manufacturing cost of the electric discharge lamp device is raised.

In order to solve the above problems, it is possible to use a structure in which the high voltage wire is not used and the electric discharge lamp and the circuit device are directly connected with each other to accomplish the electric connection as disclosed in Japanese Unexamined Patent Publication No. 10-228804. When the electric discharge lamp and the circuit device are directly connected with each other, it becomes unnecessary to use the high voltage connector and the high voltage wire.

However, when the electric discharge lamp and the circuit device are directly connected with each other and the circuit device is arranged close to the electric discharge lamp, the inner temperature of the circuit device is raised by the influence of conduction or radiation of heat generated by the electric discharge lamp and also by the influence of heat generated by the circuit device itself. Accordingly, there is a possibility of malfunction of circuit elements incorporated into the circuit device.

Further, according to Japanese Unexamined Patent Publication No. 10-228804, there is provided a bracket protruding from a rear face of the reflector of the electric discharge lamp, and the circuit device is supported by an end portion of the bracket. However, in this structure, heat generated by the electric discharge lamp stays around the circuit device because the bracket is arranged at an upper and a lower position of the circuit device. Accordingly, the temperature of the circuit device is significantly raised.

SUMMARY OF THE INVENTION

An object of the present invention is to provide an electric discharge lamp device from which a high voltage wire and a high voltage connector are removed so that a temperature rise in the circuit device can be prevented by a simple structure.

According to the electric discharge lamp device of the first aspect of the present invention, an electric discharge lamp and a circuit device for impressing a high voltage upon the electric discharge lamp are directly connected with each other so that they are electrically connected. Accordingly, it becomes unnecessary to provide a high voltage connector and a high voltage wire for connecting the electric discharge lamp with the circuit device.

The structure of the electric discharge lamp device of the first aspect of the present invention will be described as follows. There is formed a gap between a face of the circuit device, which is opposed to the reflecting member, and the reflecting member. This gap formed between the face of the circuit device, which is opposed to the reflecting member, and the rear face of the reflecting member continues to a space formed by the reflecting member and the case. Accordingly, air rises when it is heated by the influence of heat generated by the electric discharge lamp and the circuit device. This rising air is not obstructed by the circuit device. Therefore, the thus heated air quickly moves upward. Accordingly, heat is not accumulated in a gap formed between the reflecting member and the circuit device. After the thus heated air has risen, the peripheral air flows into the gap by convection.

When a profile of the circuit device opposed to the reflecting member is restricted, it is possible to cool the circuit device by a simple structure and prevent the temperature of the circuit device from rising.

The structure of the electric discharge lamp device of the first aspect of the present invention will be described as follows. There is formed a gap between a face of the circuit means, which is opposed to the reflecting member, and the reflecting member. This gap formed between the face of the circuit means, which is opposed to the reflecting member, and the rear face of the reflecting member continues to a space formed by the reflecting member and the case. Accordingly, air rises when it is heated by the influence of heat generated by the electric discharge lamp and the circuit means. This rising air is not obstructed by the circuit means. Therefore, the thus heated air quickly moves upward. Accordingly, heat is not accumulated in a gap formed between the reflecting member and the circuit means. After the thus heated air has risen, the peripheral air flows into the gap by convection.

When a profile of the circuit means opposed to the reflecting member is restricted, it is possible to cool the circuit means by a simple structure and prevent the temperature of the circuit means from rising.

According to the second aspect of the present invention, the electric discharge lamp device includes: an attaching section protruding to the right and left from the circuit means; and a boss section, which is arranged in the reflecting member, protruding onto the attaching section side so that the boss section can be positioned to the attaching section, wherein the circuit means can be fixed to the reflecting means when the attaching section and the boss section are positioned to each other. Since the attaching section and the boss section are arranged so that the circulation of air in a gap formed between the reflecting member and the circuit means can not be obstructed, air which has been heated by the heat generated by the electric discharge lamp and the circuit means can quickly goes up in the gap between the reflecting member and the circuit means. Accordingly, it According to the second aspect of the present invention, the electric discharge lamp device includes an attaching section protruding to the right and left from the circuit device and a boss section, which is arranged in the reflecting member, protruding onto the attaching section side of the reflecting member. In this configuration the boss section can be positioned adjacent to the attaching section so that the circuit device can be fixed to the reflecting means member.

Since the attaching section and the boss section are arranged so that the circulation of air in a gap formed between the reflecting member and the circuit device is not obstructed, air which has been heated by the heat generated by the electric discharge lamp and the circuit device can quickly enter the gap between the reflecting member and the circuit device. Accordingly, it is possible to positively prevent a rise in the temperature of the circuit device.

According to the electric discharge lamp device of the third aspect of the present invention, a distance between the reflecting member and the circuit device is not less than 6 mm on the upper side of the connecting section at which the electric discharge lamp is connected with the circuit device. Therefore, the width of a passage for air can be ensured. Air, heated by the electric discharge lamp, and the circuit device, moves upward and into the passage. Accordingly, air can be quickly circulated by convection, and the circuit device can be effectively cooled.

BRIEF DESCRIPTION OF THE DRAWINGS

The above object and features of the present invention will be more apparent when the following description of the preferred embodiment is read with reference to the accompanying drawings, wherein.

DESCRIPTION OF THE PREFERRED EMBODIMENT

Referring to the accompanying drawings, an embodiment of the present invention will be explained below.

Figure 1:
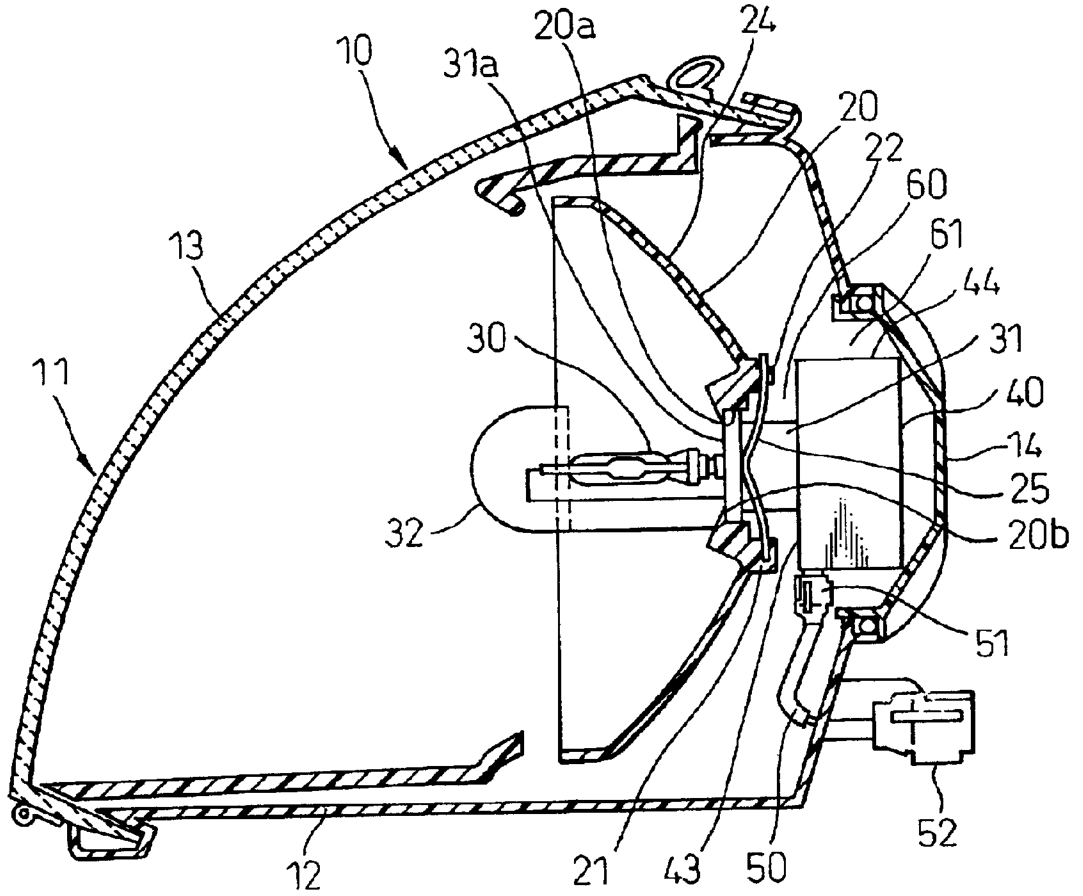
FIG. 1 is a cross-sectional view showing a headlight of an embodiment of the present invention.
Figure 2:
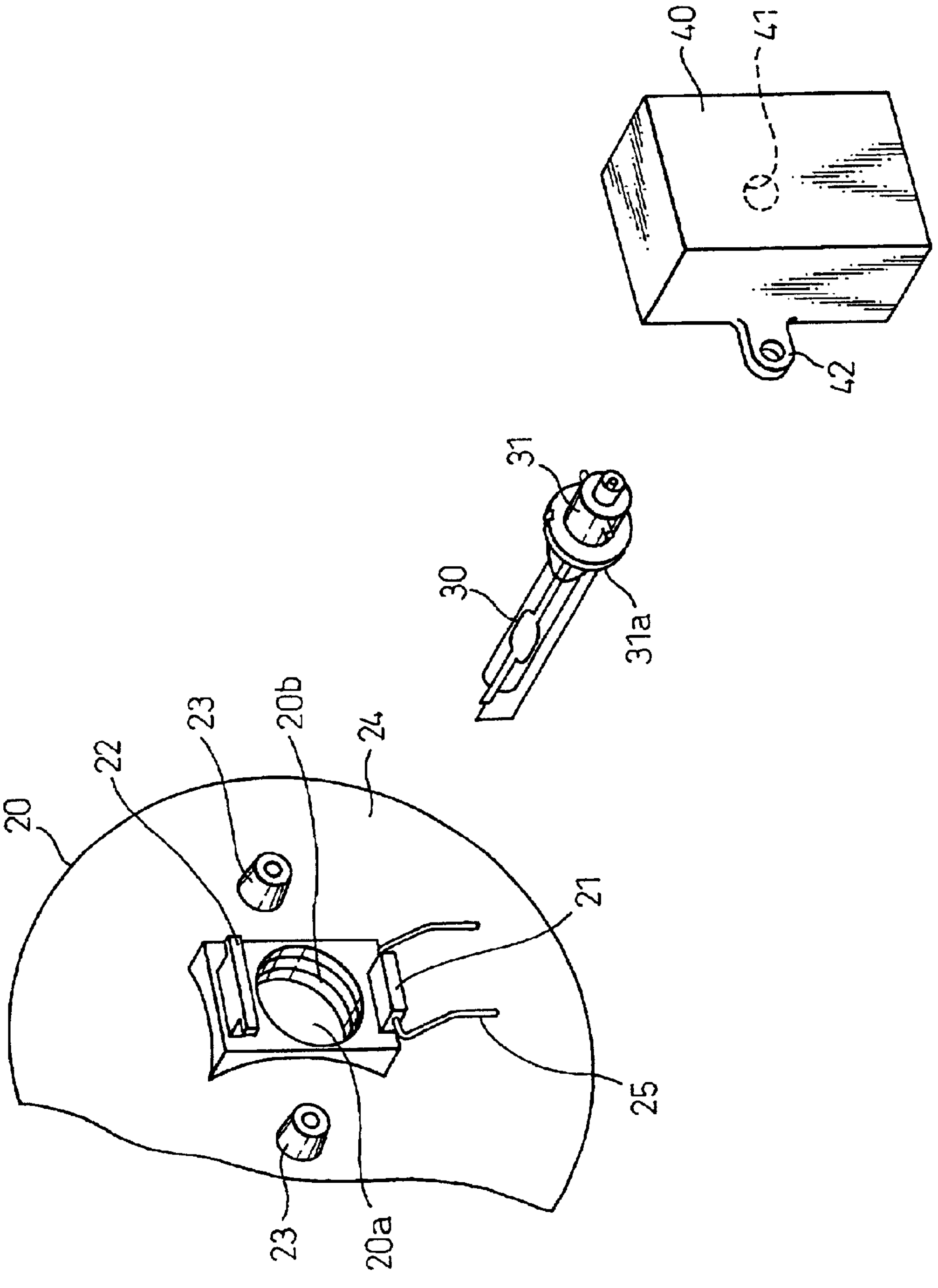
FIG. 2 is an exploded perspective view showing a headlight of the present embodiment.

FIGS. 1 and 2 are views showing an embodiment in which the electric discharge lamp of the present invention is applied to a headlight of a vehicle. The headlight 10, which is an electric discharge lamp, includes a case 11, a reflecting member 20, an electric discharge lamp 30 and a circuit means, or circuit device 40. The case 11 includes a case body 12, a lens 13 and a cover 14 and houses a the reflecting member 20, the electric discharge lamp 30 and the circuit device 40.

The reflecting member 20 is a support member having a mechanism capable of adjusting the optical axis. This reflecting member 20 is movably supported by the case body 12. The reflecting member 20 is made of resin and formed into a cup-shape. On the concave reflecting face of the reflecting member 20, there is provided reflecting material by which a beam of light emitted from the electric discharge lamp 30 is reflected forward. On the rear face 24 side of the reflecting member 20, there is provided a boss section 23 (shown in FIG. 2) to which the circuit device 40 is attached.

The electric discharge lamp 30 is inserted into the through-hole 20*a* of the reflecting member 20. The shade 32 shuts off a beam of direct light, which proceeds forward, emitted from the electric discharge lamp 30. The spring 25 is pivotally attached to the support section 21 formed on the outer circumference of the through-hole 20*a*. When both ends of the spring 25 are engaged with a pair of pawls located on the opposite side of the support section 21 with respect to the through-hole 20*a*, the spring 25 pushes the connector section 31 of the electric discharge lamp 30 against the reflecting member 20 in the periphery of the through-hole 20*a*. When the contact face 31*a* of the connector section 31 on the electric discharge lamp 30 side comes into contact with the connector section side end face 20*b* provided in the reflecting member 20, the electric discharge lamp 30 and the circuit device 40 can be positioned close to each other.

The circuit device 40 is provided with a circuit to impress a high voltage upon the electric discharge lamp 30. When the connector section 41 of the circuit device 40 shown in FIG. 2 and the connector section 31 of the electric discharge lamp 30 are directly connected with each other, the electric discharge lamp 30 and the circuit device 40 can be electrically connected with each other. The connector section 31 and the connector section 41 form a connecting section in which the electric discharge lamp 30 and the circuit device 40 are connected with each other. The circuit device 40 has an attaching section 42 at positions corresponding to the two boss sections 23 symmetrically arranged in the traverse direction with respect to the center of the through-hole 20*a* of the reflecting member 20 so that the circuit member can be attached to the reflecting member 20. When the attaching section 42 and the boss section 23 are positioned and fixed to each other by means of a screw, the circuit member is attached to the reflecting member 20*c*

Figure 3:
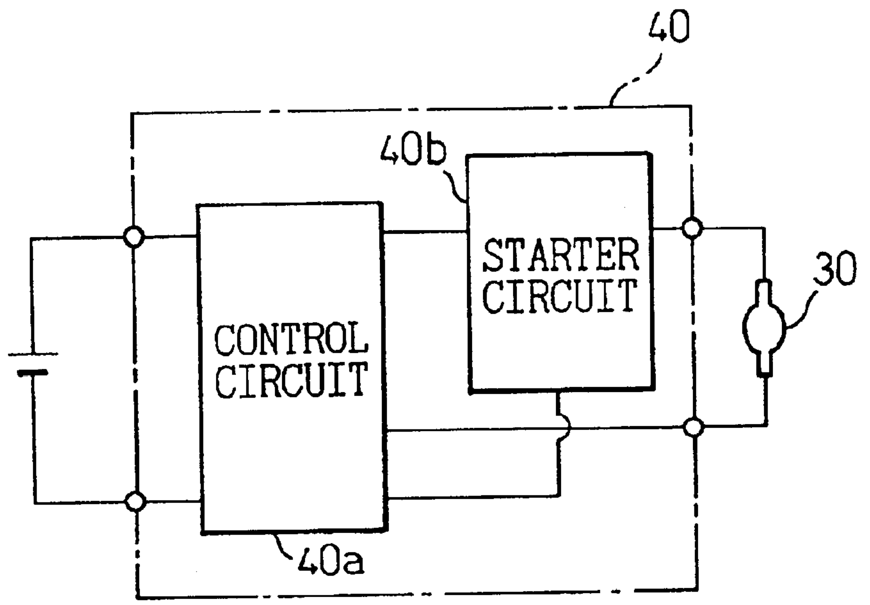
FIG. 3 is a schematic illustration showing a circuit device of the present embodiment.
Figure 4:
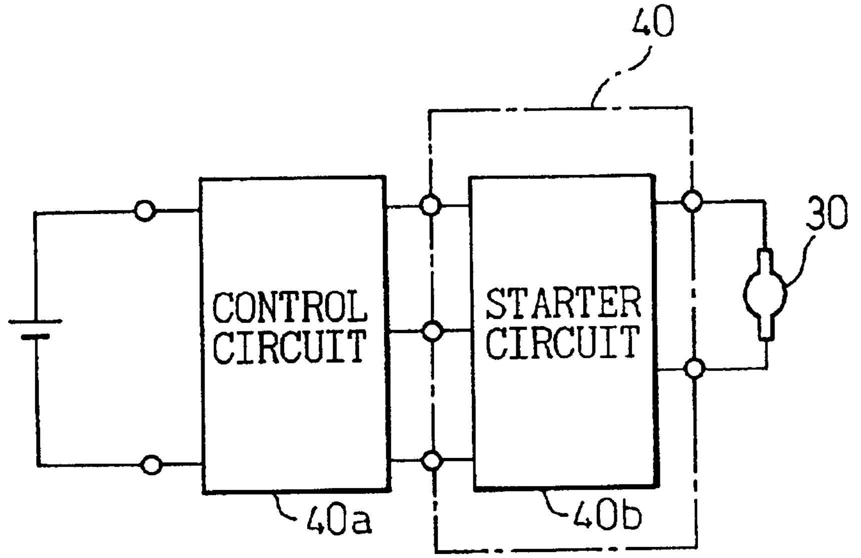
FIG. 4 is a schematic illustration showing a circuit device of the present embodiment.

As shown in FIG. 3, the circuit device 40 may be provided with both the control circuit 40*a* and the starter circuit 40*b*. Otherwise, as shown in FIG. 4, the circuit device 40 may be provided with only the starter circuit 40*b*. The starter circuit 40*b* impresses a high voltage upon the electric discharge lamp 30 when the electric discharge lamp 30 is operated. The control circuit 40*a* controls electric power supplied to the electric discharge lamp 30.

When the electric discharge lamp 30 and the circuit device 40 are incorporated to each other as shown in FIG. 1, the electric discharge lamp 30 and the circuit device 40 are not contacted with the case 11 but are movable with respect to the case 11. Accordingly, it is possible to adjust the optical axis of the electric discharge lamp 30 manually or automatically.

The voltage of a battery, not shown, is impressed upon the circuit device 40 via an electric power source cord 50. The electric power source cord 50 is connected with the circuit device 40 by the connector 51 and also connected with the battery side by the connector 52.

Next, an explanation will be made into a relation between a distance "d" from the reflecting member 20 to the circuit device 40 and the inside temperature of the circuit device 40.

Figure 5:
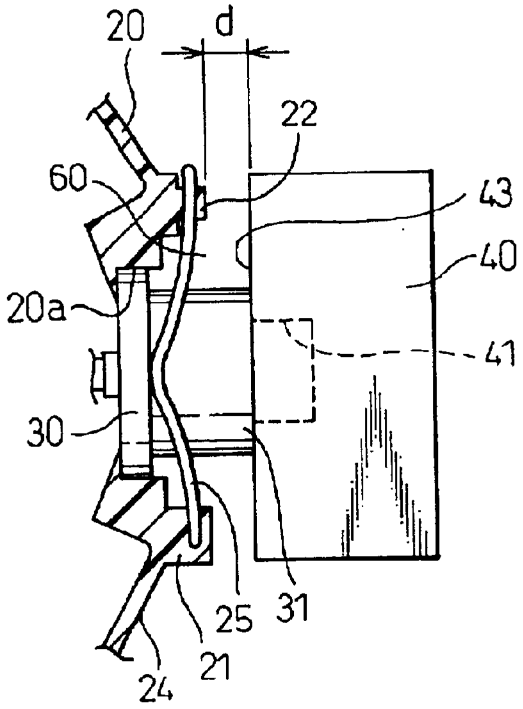
FIG. 5 is a cross-sectional view showing a gap formed between the reflecting member and the circuit device of the present embodiment.

Air in the gap 60 formed between the reflecting member 20 and the circuit device 40 is heated by the heat generated by the electric discharge lamp 30 and the circuit device 40 and moves upward in the perpendicular direction. As shown in FIG. 5, the opposite face 43 of the circuit device 40, which is opposed to the reflecting member 20, extends along a perpendicular face passing through a connecting position in the perpendicular direction at which the electric discharge lamp 30 and the circuit device 40 are connected with each other. The rear face 24 of the reflecting member 20 facing the circuit device 40 is convex. Accordingly, heated air in the gap 60 goes up in the perpendicular direction without being obstructed by the rear face 24 of the reflecting member 20 and the opposed face 43 of the circuit device 40. As the space 61, which is formed by the upper face 44 of the circuit device 40, the cover 14 of a portion of the case 11 and the case body 12, continues to the gap 60, the heated airy which moves upward in the gap 60 in the perpendicular direction, smoothly flows into the space 61. After hot air has moved upward, cold air in the periphery flows into the gap 60. Therefore, a good convection of air is generated around the gap 60. Due to the foregoing, heat is not accumulated in the gap 60 but the circuit device 40 is cooled. Therefore, the temperature of the circuit device 40 is prevented from rising. Accordingly, malfunction of the circuit elements in the circuit device 40 can be prevented.

Figure 6:
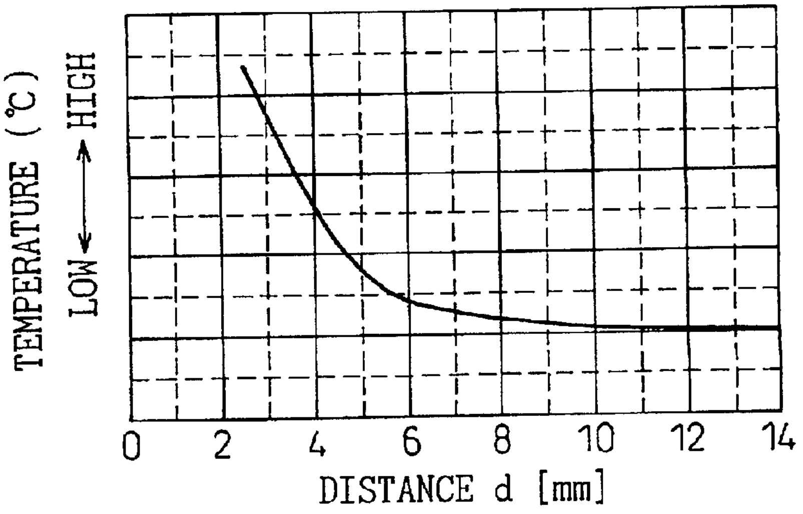
FIG. 6 is a characteristic diagram showing a relation between the distance from the reflecting member to the circuit device and the temperature of the present embodiment.

As shown in FIG. 6 when the distance "d" between the reflecting member 20 and the circuit device 40 is decreased smaller than 6 mm, the inside temperature of the circuit device 40 is sharply raised. Therefore, it is preferable that the distance "d" is greater than or equal to 6 mm.

In this embodiment, when the entire opposed face 43 of the circuit device 40, which is opposed to the reflecting member 20, extends along the perpendicular face, a convection of air can be quickly performed.

The opposed face of the circuit device 40, which is opposed to the rear face of the reflecting member 20, is not limited to a plane. The opposed face of the circuit device 40 may be a curved face. Alternatively, the opposed face of the circuit device 40 may be protruded and recessed. That is, it is sufficient that a gap is formed between the reflecting member 20 and circuit device 40.

In order to make the heated air easily move upward in the gap 60, it is preferable that the support section 21, which is formed on the rear face 24 of the reflecting member 20 and used for attaching the spring 25, and the pawls 22 are made to come close to the rear face 24 so that the number of portions protruding into the circuit device 40 can be reduced.

What is claimed is:

1. An electric discharge lamp device comprising:

an electric discharge lamp;

a reflecting member for reflecting light emitted from the electric discharge lamp, arranged at the rear of the electric discharge lamp, a circuit means for impressing a high voltage upon the electric discharge lamp, arranged on the side opposite to the electric discharge lamp side of the reflecting member, formed differently from the electric discharge lamp, directly connected with the electric discharge lamp so that the circuit means is electrically connected with the electric discharge lamp;

a connector section for directly and electrically connecting the circuit means and the electric discharge lamp;

a spring for pushing the connector section against the reflecting member to position the electric discharge lamp and the circuit means close to each other; and a case for covering an upper portion of the circuit means, wherein a gap formed between an opposed face of the circuit means, which is opposed to a rear face of the reflecting member, and the reflecting member, the gap continuing unobstructed to a space formed between an upper face of the circuit means and the case.

2. An electric discharge lamp device according to claim 1, further comprising:

an attaching section protruding from the circuit means to the right and left; and a boss section protruding from the reflecting member onto the attaching section side so that the boss section can be is positioned adjacent to the attaching section, wherein the circuit means is fixed to the reflecting member when the attaching section is positioned to the boss section, and the attaching section and the boss section are arranged so that air circulates freely in die gap formed between the reflecting member and the circuit means.

3. An electric discharge lamp device according to claim 1, wherein a distance between the reflecting member and the circuit means is not less than 6 mm in the perpendicular direction on the upper side of a connecting position at which the electric discharge lamp and the circuit means are connected with each other.

4. An electric discharge lamp device comprising:

an electric discharge lamp;

a circuit device for providing a high voltage to the electric discharge lamp, wherein the circuit device has an attaching section;

a reflecting member for reflecting light emitted from the electric discharge lamp and having a reflecting face and a rear face, wherein the reflecting member has a boss section;

a case for covering an upper portion of the circuit device;

a connector section for directly connecting the circuit device and the electric discharge lamp by fixing the attaching section and the boss section to each other, wherein the connector section and the case are positioned such that air flows between the reflecting member and the circuit device and between the circuit device and the case;

a spring for pushing the connector section against the reflecting member to position the electric discharge lamp and the circuit device close to each other;

an attaching section protruding from die circuit device; and a boss protruding from the rear side of the reflecting member and being positioned adjacent to the attaching section, wherein the attaching section and the boss interconnect to attach the circuit member the reflecting member.

* * * * *